(12) United States Patent
Osborne

(10) Patent No.: US 7,816,961 B2
(45) Date of Patent: Oct. 19, 2010

(54) SYSTEM AND METHOD FOR SIGNAL ADJUSTMENT

(75) Inventor: Josh Osborne, Cary, NC (US)

(73) Assignee: Qimonda North America, Cary, NC (US)

( * ) Notice: Subject to any disclaimer, the term of this patent is extended or adjusted under 35 U.S.C. 154(b) by 0 days.

(21) Appl. No.: 12/028,294

(22) Filed: Feb. 8, 2008

(65) Prior Publication Data

US 2009/0201059 A1 Aug. 13, 2009

(51) Int. Cl.
*H03L 7/06* (2006.01)
(52) U.S. Cl. ...................... 327/158; 327/149
(58) Field of Classification Search .................. None
See application file for complete search history.

(56) References Cited

U.S. PATENT DOCUMENTS

| | | | |
|---|---|---|---|
| 5,994,934 A * | 11/1999 | Yoshimura et al. | 327/158 |
| 6,628,154 B2 * | 9/2003 | Fiscus | 327/158 |
| 6,674,314 B2 * | 1/2004 | Takai | 327/158 |
| 6,731,147 B2 * | 5/2004 | Fiscus | 327/158 |
| 6,985,401 B2 * | 1/2006 | Jang et al. | 365/194 |
| 6,987,408 B2 * | 1/2006 | Kim | 327/158 |
| 7,098,712 B2 * | 8/2006 | Lee | 327/161 |
| 7,109,774 B2 * | 9/2006 | Kim | 327/277 |
| 7,119,592 B2 * | 10/2006 | Cooper | 327/158 |
| 7,239,575 B2 * | 7/2007 | Kim | 365/189.05 |
| 7,378,888 B2 * | 5/2008 | Sato | 327/158 |
| 7,449,927 B2 * | 11/2008 | Kim | 327/156 |

* cited by examiner

*Primary Examiner*—Cassandra Cox
(74) *Attorney, Agent, or Firm*—Fay Kaplun & Marcin, LLP

(57) ABSTRACT

Embodiment of the present invention relate to a method for receiving a first signal, determining a first characteristic of the first signal, the characteristic being a time based characteristic, receiving a second signal and processing the second signal through a predetermined range of delay elements, an initial minimum number of delay elements in the predetermined range being adjustable, the processed second signal having a second characteristic substantially corresponding to the first characteristic of the first signal.

11 Claims, 5 Drawing Sheets

SYSTEM AND METHOD FOR SIGNAL ADJUSTMENT

BACKGROUND INFORMATION

As electronic devices become increasingly complex, device designers have been required to take internal delays of device components into consideration. In digital circuits, these internal delays contribute to the phenomenon known as clock skew, in which a clock or other reference signal that is input into a digital circuit is perceived by different components of the digital circuit as arriving at different times. That is, as the clock signal propagates throughout the digital circuit, components that expect to receive the same clock signal may actually receive clock signals that are out of phase with each other. In synchronous digital circuits, proper timing between components is required for driving the digital logic of the circuits and initiating events such as latching of data, driving data, changing logic states, shifting pointers, etc. Thus, the internal delays may cause the components to become unsynchronized, resulting in internal signals that occur at unanticipated times, often with harmful results such as device malfunction or failure.

There are two common methods for eliminating clock skew: PLL (Phase Locked Loop) and DLL (Delay Locked Loop). A PLL uses an adjustable oscillator to reproduce the frequency and phase of a reference clock. A DLL uses an array of fixed delay elements to add to the (skewed) source clock so that it matches the (unskewed) reference clock.

SUMMARY

Embodiments of the present invention relate to a method for receiving a first signal, determining a first characteristic of the first signal, the characteristic being a time based characteristic, receiving a second signal and processing the second signal through a predetermined range of delay elements, an initial minimum number of delay elements in the predetermined range being adjustable, the processed second signal having a second characteristic substantially corresponding to the first characteristic of the first signal.

DETAILED DESCRIPTION

Figure 1:
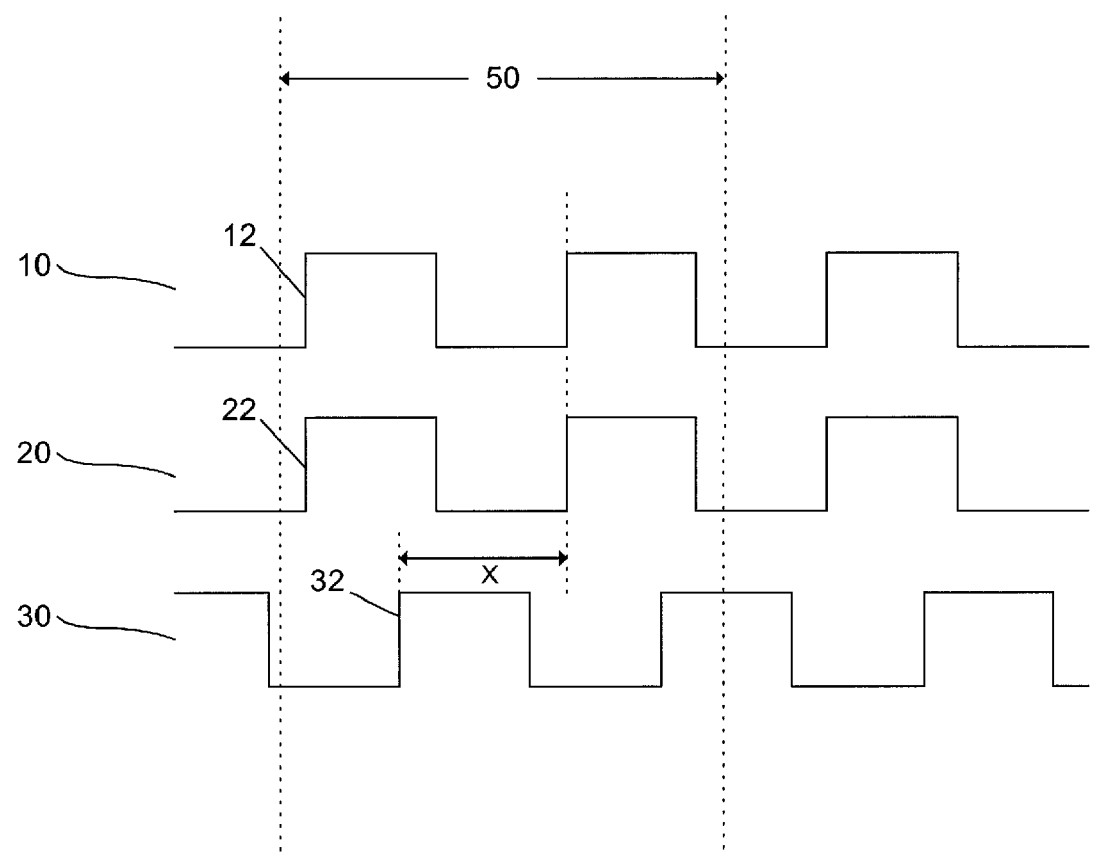
FIG. 1 shows an exemplary timing diagram including a plurality of signals.

Embodiment of the present invention may be further understood with reference to the following description of exemplary embodiments and the related appended drawings, wherein like elements are provided with the same reference numerals. The exemplary embodiments of the present invention are described with reference to a system and a method for signal adjustment utilizing delay-locked loops ("DLLs").

In one exemplary embodiment, a DLL is implemented as part of control circuitry for a device. Those skilled in the art will understand that the signal adjustment systems and methods described herein may be implemented in any system where the signal adjustment functionality may be useful.

When a reference signal (e.g., a clock signal) is applied to the device, the reference signal may experience propagation delay after passing through one or more internal components of the device. The DLL attempts to compensate for the delay by receiving the delayed reference signal and producing an output signal that matches the original reference signal. This output signal may then be utilized by a further component of the device or by another device coupled to the further component. Thus, the DLL keeps the one or more internal components synchronized with the further component/other device.

Before the DLL first begins to produce the output signal (such as when power is initially applied to the device or when the DLL is reset) the DLL may enter a "seek mode" either immediately after application of power/resetting, or soon thereafter (e.g., after the DLL is initialized). In the seek mode, the DLL attempts to add positive delay to the delayed reference signal in an attempt to produce the output signal that matches the reference signal. This is an incremental process in which the DLL "seeks" to find an appropriate amount of delay to be added before the output and reference signals are matched. Once the DLL determines that the signals are matched, the DLL maintains this delay and the output signal becomes "locked" onto the reference signal. After this initialize-seek-lock sequence, the DLL may enter a "normal mode" of operation in which the DLL continues to keep the output signal matched to the reference signal by either providing additional delay or subtracting delay (e.g., until the delay is zero). A graphical illustration of how the output signal is locked during the seek mode will now be described with reference to FIG. 1.

FIG. 1 shows a timing diagram illustrating a plurality of signals including a reference signal 10, which may be any type of signal such as a clock signal comprising a steady stream of uniform pulses at a fixed frequency. Although the exemplary signals shown in FIG. 1 are square waves, other embodiments may feature other types of periodic waveforms such as sinusoids, saw-tooths, triangles, etc. The first component may be a discrete component or a module that includes a plurality of components. The first component may be a conceptual representation of the delay incurred when the reference signal 10 propagates to a second component of the device. Thus, the first component and the second component may represent two distinct physical locations in the DRAM device, both of which receive a different version of the reference signal (e.g., the reference signal 10 and a delayed reference signal 30, respectively).

Signal 30 in FIG. 1 is an example of a delayed clock signal which has skew (phase difference) relative to the original clock signal 10. This delayed clock has the same frequency as the original clock, but it differs from the original in phase. Synchronous logic often requires actions to happen at distinct times relative to a master clock. Therefore in such applications, it is desirable to create a new clock signal 20 by adding delay to signal 30.

As shown in FIG. 1, the signal 30 is out of phase with the signal 10 and is, therefore, mismatched (i.e., the edge 12 is misaligned with the edge 32). The signal 30 may be adjusted to more closely approximate the signal 10, by inputting the signal 30 along with a feedback signal into a DLL that produces the output signal 20 by delaying the signal 30 by a fixed amount, X. The output signal 20, which has an edge 22 that is aligned with edge 12, may then be substituted for the signal 30 so that the second component receives a signal that matches the signal 10. Because the seek mode only allows positive delays, X represents a positive value. As will be explained in further detail below, when the DLL is initialized or reset, the signal 30 is first delayed by a fixed initial delay, Nr, and additional delays are then incrementally added (i.e., seeking forward until the DLL determines that the signals 10 and 20 are locked).

DLLs usually utilize fixed-delay elements that make use of RC delays. These fixed-delay elements utilize fixed signal slew rates to create fixed timing delays. Signal slew rates are a measure of the rate of change in output (typically measured in Volts/nanosecond), and are a characteristic of any RC delay circuit. These fixed slew rates limit the top speed at which the DLL can function correctly. At any given time, if the slew rate is not fast enough to saturate a high or low logic state before the next clock edge (e.g., a leading edge of the next pulse), the timing of a previous edge may affect the timing of the next edge. In other words, pulses may overlap if the DLL cannot respond quickly enough when attempting, for example, to shift the signal 30. This interaction between pulse edges causes what is known as "jitter magnification." That is, when unwanted signal variations (e.g., "jitter") occur on an input such as the signal 30, even a small amount of such input jitter can cause a large output jitter. In extreme cases, this may even result in pulse extinction, where the interference results in incoherent noise instead of discrete pulses. The effects of input jitter are also cumulative and increase in proportion to the number of fixed-delay elements used.

Initial configuration of the DLL involves setting the value of an initial delay Nr The initial delay Nr is a starting point for the seeking process and sets a minimum value for an initial locked state. Exemplary embodiments of the present invention allow the initial minimum delay Nr to be changed when the DLL is reset.

Figure 2:
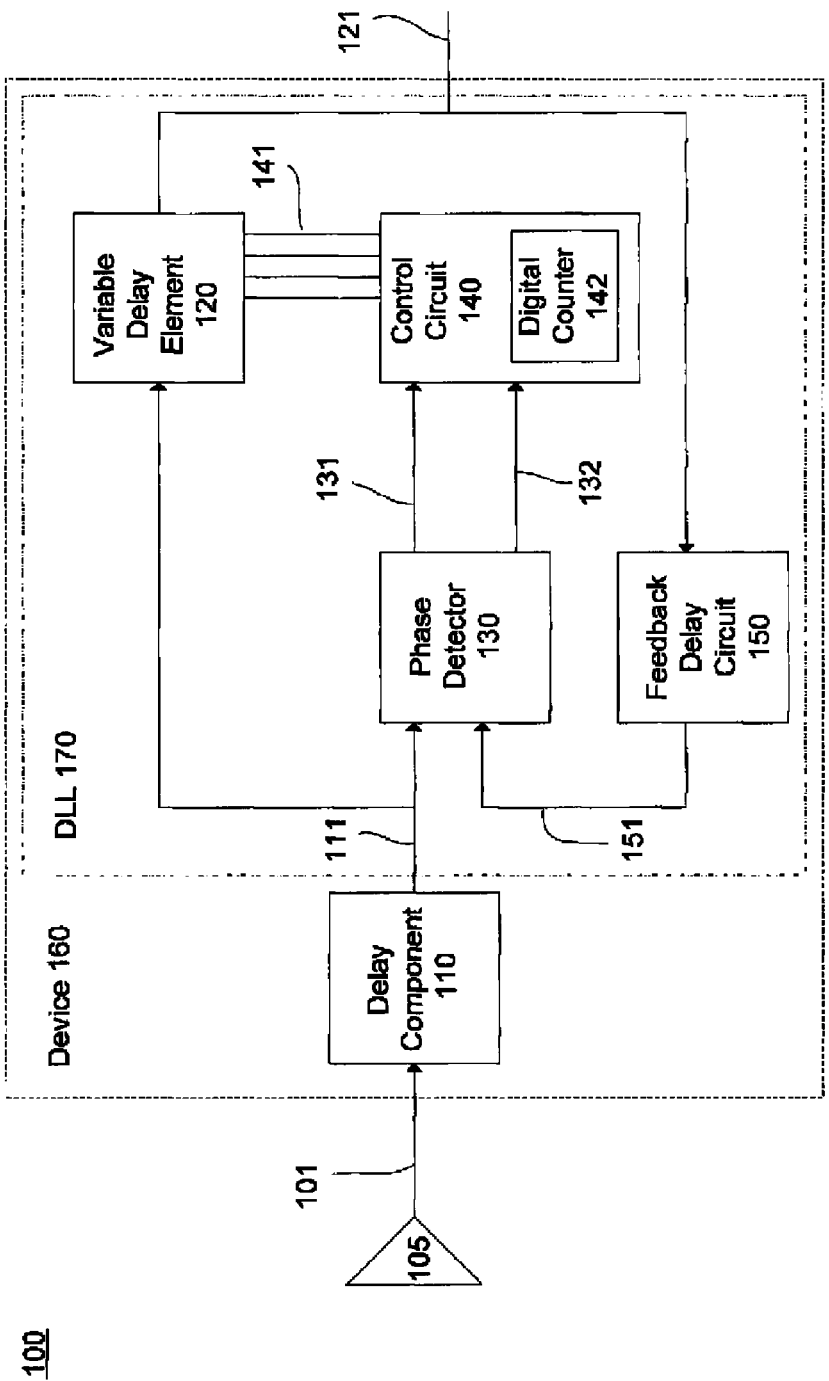
FIG. 2 shows a block diagram of a system for signal adjustment according to an embodiment of the present invention.

FIG. 2 shows a system 100 according to an embodiment of the present invention. The system 100 includes a signal source 105 (e.g., an external clock source) that inputs a reference signal 101 into a device 160. The device 160 may comprise any number of electronic components, including a delay component 110. As discussed above, the delay component 110 may be either an actual, functional component or a conceptual representation of a propagation delay that results from the propagation of a reference signal (e.g., the signal 101) through various portions of the device 160 (e.g., analog and/or digital components, wiring, etc.). The output of the delay component 110 is a delayed reference signal 111, which is coupled to a DLL 170.

The DLL 170 may include a phase detector 130, a variable delay element 120, a control circuit 140 and a feedback delay circuit 150. The phase detector 130 receives the signal 111 and compares the signal 111 to a feedback signal 151 generated by the feedback delay circuit 150. As will be discussed below, when an output signal 121 of the DLL 170 is matched to the signal 101, the signal 111 will match the signal 151. This matching occurs because the delay of the feedback delay circuit 150 is designed to match the delay of component 110 across all variations of temperature and voltage. The phase detector 130 determines whether the signals 111, 151 are in phase with each other. The phase detector 130 produces one or more output signals (e.g., a "count up" signal 131 and a "count down" signal 132) to the control circuit 140 as a function of comparing the signals 111, 151. For example, when the signals 111, 151 are matched, both counting signals 131, 132 may not be asserted. If additional positive delay is required, only the signal 131 may be asserted. Similarly, if negative delay is required, only the signal 132 maybe asserted.

The control circuit 140 may include a digital counter 142 and a storage device (not shown). The control circuit 140 may be a microprocessor, an application-specific integrated circuit ("ASIC"), an embedded controller, or any other control circuit. The control circuit 140 may receive a user-specified DLL configuration and control operation of the system 100 in accordance with the DLL configuration. For example, the user may specify the initial minimum delay value Nr, which is stored in the storage device. The storage device may be any type of storage that includes one or more storage elements such as a register for storing data. In an exemplary embodiment, the memory is non-volatile. However, in other embodiments, the memory may be volatile or a combination of non-volatile and volatile memory. The memory may include one or more registers for storing data such as the value of Nr.

The memory may be written to in any number of ways. For example, the memory may be set using a mode register control circuit (not shown) coupled thereto. The user may interface directly with the mode register control circuit by physically accessing control pins thereof. Alternatively, the user may interface with the mode register control circuit by inputting a "mode register set" command via a software interface that enables the initial value Nr to be written to and/or read from the memory. In other embodiments, the memory may be set using a fuse or an electrically programmable fuse ("eFuse") to physically wire the contents of the memory. Depending on how the memory is implemented, the memory may be rewritten at a later point in time such as when the DLL 170 is subsequently reset.

As discussed above, the control circuit 140 receives the counting signals 131, 132. Depending on which counting signal is asserted, the counter may be either incremented or decremented to control the variable delay element 120 by transmitting a delay value along a signal bus 141. When the DLL 170 is reset or initialized, the counter is also reset to an initial delay value equal to the value of the Nr. The initial delay value is then output to the variable delay element 120 via the bus 141.

Figure 3:
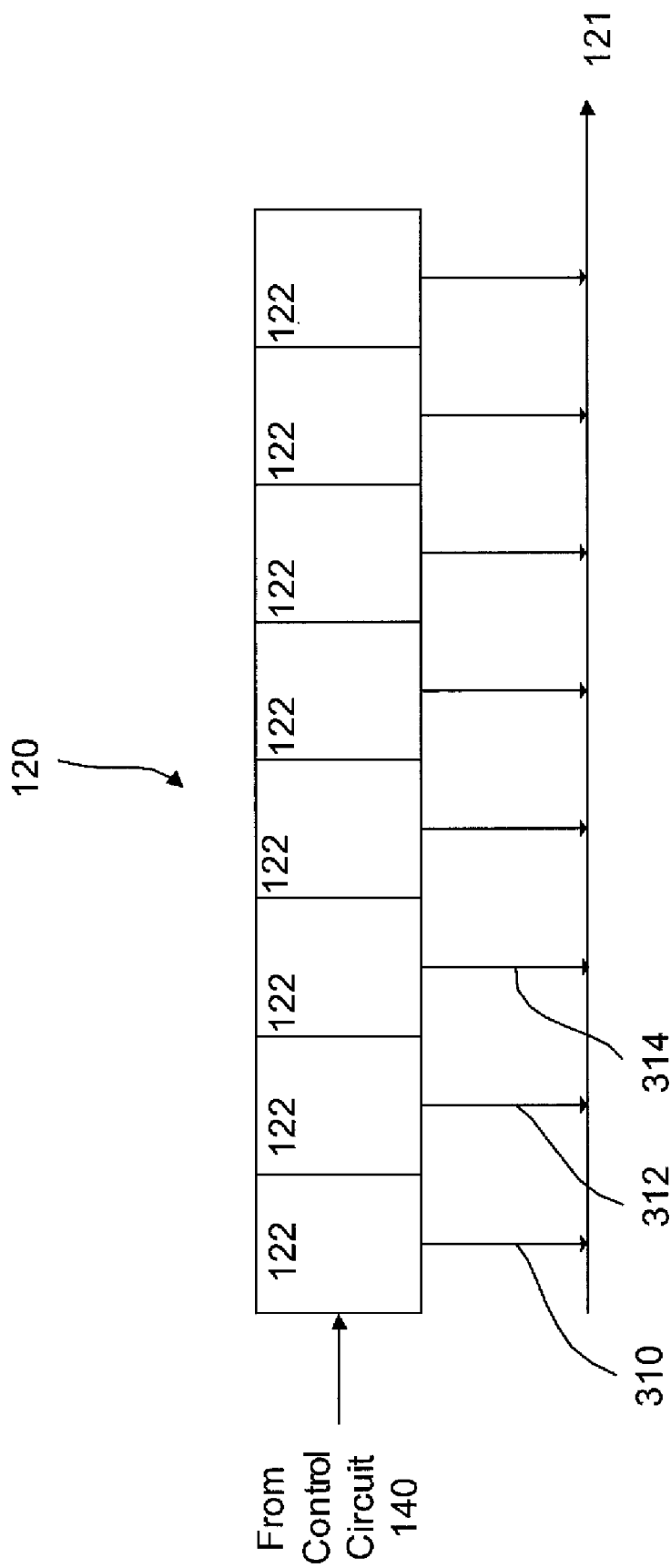
FIG. 3 shows a detailed view of the system of FIG. 2 according to an embodiment of the present invention.

The variable delay element 120 may comprise a plurality of fixed-delay elements that each contributes to a delay of the output signal 121 relative to the reference signal 101. FIG. 3 shows a detailed view of an exemplary embodiment of the delay element 120. As shown in FIG. 3, the delay element 120 may include a plurality of fixed-delay elements 122, which are chained (e.g., cascaded) together with an output of a previous fixed-delay element 122 being fed as input to the next fixed-delay element 122. The fixed-delay element 122 may be a simple RC circuit comprising a resistor and a capacitor. In another embodiment, the fixed-delay element 122 may comprise an inverter in series with a capacitive load. In other embodiments, the fixed-delay element 122 may comprise any first-order circuit that is non-oscillating. The delay element 120 is able to generate one or more output signals with varying delays. For example, a first fixed-delay element 122 in the chain may generate a first delayed output signal that is delayed by a fixed amount, a second fixed-delay element 122 may add an additional delay to the first delayed output signal and output a second delayed output signal, etc. One of the delayed output signals may then be selected as the output signal 121 for the DLL 170. The selection is based on the value of the counter and may be performed using a multiplexer (not shown) that selects one of the delayed output signals. As previously discussed, the counter is reset to the initial value Nr during DLL initialization, when in the seek mode. Thus, if the initial value Nr is equal to 1, the control circuit 140 may set the counter to select a delayed output signal 310. Similarly, if the initial value Nr is equal to 2 or 3, the counter may be set to respectively select a delayed output signal 312 and a delayed output signal 314. During the normal mode, the output signal 121 is selected by incrementing or decrementing the counter depending on whether an increase or a decrease in delay is desired.

The output signal 121 is also transmitted to the feedback delay circuit 150, which is designed to produce a delay equivalent to that of the delay component 110. For instance, the delay circuit 150 may be an exact duplicate of the delay component 110. Alternatively, the delay circuit 150 may be an adjustable circuit that can be calibrated automatically and/or manually to match the delay of the delay component 110. Thus, if the output signal 121 matches the reference signal 101, then the signals 111, 151 should also match and the phase detector 130 will determine that there is zero phase difference between the signals 111, 151.

Flexibility in selecting the initial value Nr is desirable for a number of reasons. For example, the selection of the initial value Nr may require a balance between jitter margin and headroom. Because different types of applications may have different requirements, it is desirable to be able to change the value of the initial value Nr to fit the application. For example, applications may differ with respect to power and speed characteristics. A first application may be characterized by slow operating speeds and unstable power rails. Variations in the output of the delay element 120. Thus, the first application may require more headroom (e.g., a larger Nr) to accommodate the large variations in the output of the delay element 120. In contrast, a second application may be characterized by high speeds and stable power rails. In this latter situation, less headroom may be required and it would therefore be advantageous to select a smaller Nr in order to have an increased jitter margin.

Thus, the exemplary embodiments of the present invention, in allowing for the DLL 170 to have a settable initial minimum delay (Nr), enables the handling of different applications in which the DLL 170 is being implemented. As described above, this adjustment to the Nr may be made by, for example, an e-fuse setting at the final component test. If the Nr is set by the use of an e-fuse or fuse, it may be possible to determine this by observing the layout in the DLL 170 logic. Using a fuse or e-fuse to set the Nr at final component test is an example of the manufacturer of the device setting the Nr.

As described above, in another exemplary embodiment, it may be possible that a user of the device may set the Nr, using, for example, a mode register set command to set the register to the correct Nr value. In such a case, the user may configure the DLL 170 based on the application that is desired by the user. That is, the user is not required to purchase different devices for different applications. Rather, embodiments of the present invention allows the user to purchase a single device and to modify the initial value Nr, as needed, for the particular application. In addition, the exemplary embodiments may also allow the manufacturer to manufacture a single device and modify the Nr, as needed.

It should be noted that in the exemplary embodiment of FIG. 2, the DLL 170 is shown as an integral component of the device 160. However, those skilled in the art will understand that this is only for illustrative purposes. That is, the DLL 170 may be included as a separate component of the system 100. In addition, embodiments of the present invention may be implemented for any component that requires signal adjustment. This applies to memory devices and/or any other type of component, e.g., processors, displays, ASICs, motherboards, any integrated circuit, etc. Finally, embodiments of the present invention may be used to adjust and/or control any type of signal, e.g., control signals, communication signals, data transfer signals, etc.

Figure 4:
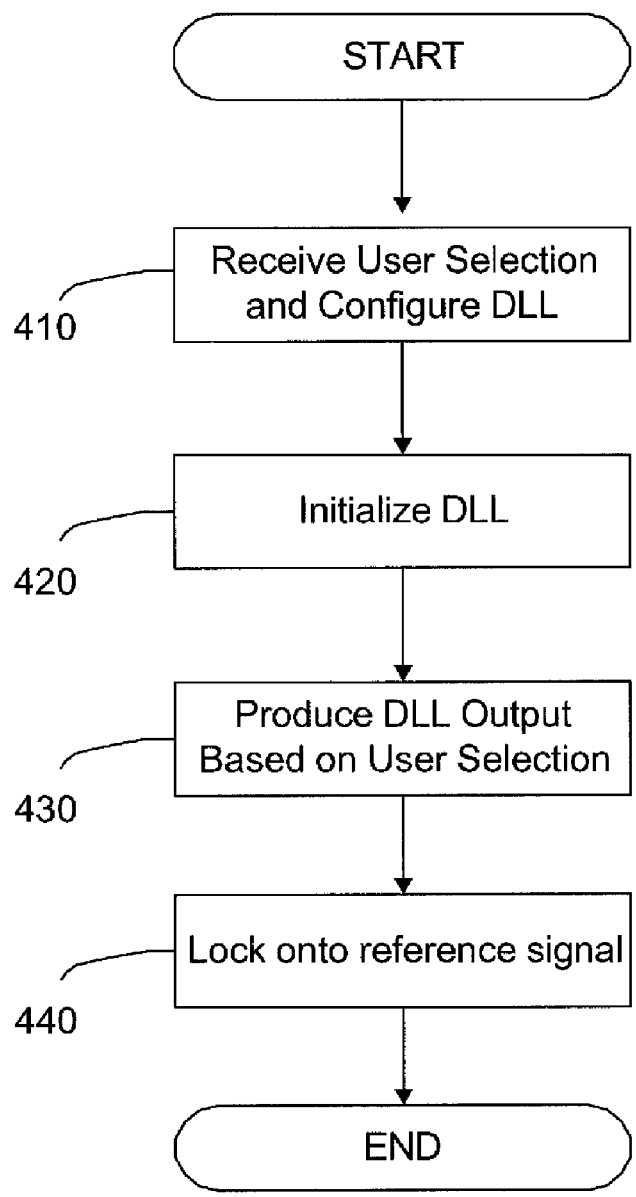
FIG. 4 shows a method for generating a signal output according to an embodiment of the present invention.

FIG. 4 shows an exemplary method 400 for configuring a DLL according to an embodiment of the present invention. The method 400 may be executed on the system 100 and will be described with reference thereto. In step 410, the system 100 receives a user selection corresponding to a desired DLL configuration. As previously described, the DLL configuration may include a specific value for the initial minimum number of fixed-delay elements, Nr. The user selection is saved, thereby setting the initial minimum number of fixed-delay elements each time the DLL 170 is reset.

As described above, the memory may be configured to store the Nr in a variety of manners. For example, an end-user may program a memory device. Alternatively, the memory may be fuse programmable at a wafer level (e.g., before the memory is packaged and integrated into the system 100). In another exemplary embodiment, the memory may include eFuses that allow the DLL 170 to be reset after the system 100 has been assembled and/or tested. In some exemplary embodiments, the resetting may require physical access to the system 100 (e.g., control pins of the memory). In other embodiments, the resetting may be performed entirely via a software interface (e.g., by issuing a mode register set command to the device where the DLL resides). It should also be noted that the term "user" may describe any entity such as an end user, a manufacturer, a reseller, etc.

In step 420, the system 100 initializes the DLL 170. That is, the DLL 170 returns to an initial state in which it has not yet begun to produce output. This may occur when the DLL 170 is reset or when power is applied to the device 160. The delayed reference signal 111 is then applied as input to the phase detector 130 and the DLL 170 begins producing the output signal 121. The application of the signal 111 may be manual or automatic (e.g., the DLL 170 starts processing the signal 111 immediately after resetting occurs).

In step 430, the system 100 produces DLL output (e.g., the output signal 121) based on the user selection. The control circuit 140 resets the counter to the value of the Nr, thereby instructing the delay element 120 to select a delayed output signal produced by the delay element 120, as a function of the initial value Nr. For example, referring to FIG. 3, if the Nr value is set to two (2), the output signal 312 will be used, e.g., the output signal from the second delay element 122. The output signal is also sent to the delay circuit 150, which produces the feedback signal 151.

In step 440, the system 100 locks onto the reference signal 101 by feeding the feedback signal 151 back into the phase detector 130. If the output signal 121 requires additional delay, the counter is incremented, causing an additional fixed-delay element 122 to be selected. This seeking behavior continues until the phase detector 130 determines that the feedback signal 151 matches the delayed reference signal 111. Alternatively, if additional delay is not required, no further incrementing of the counter is performed. At this time, the output signal 121 is matched to the reference signal 101 and the DLL 170 is locked. The method 400 is now complete and the DLL 170 enters the normal mode of operation.

Figure 5:
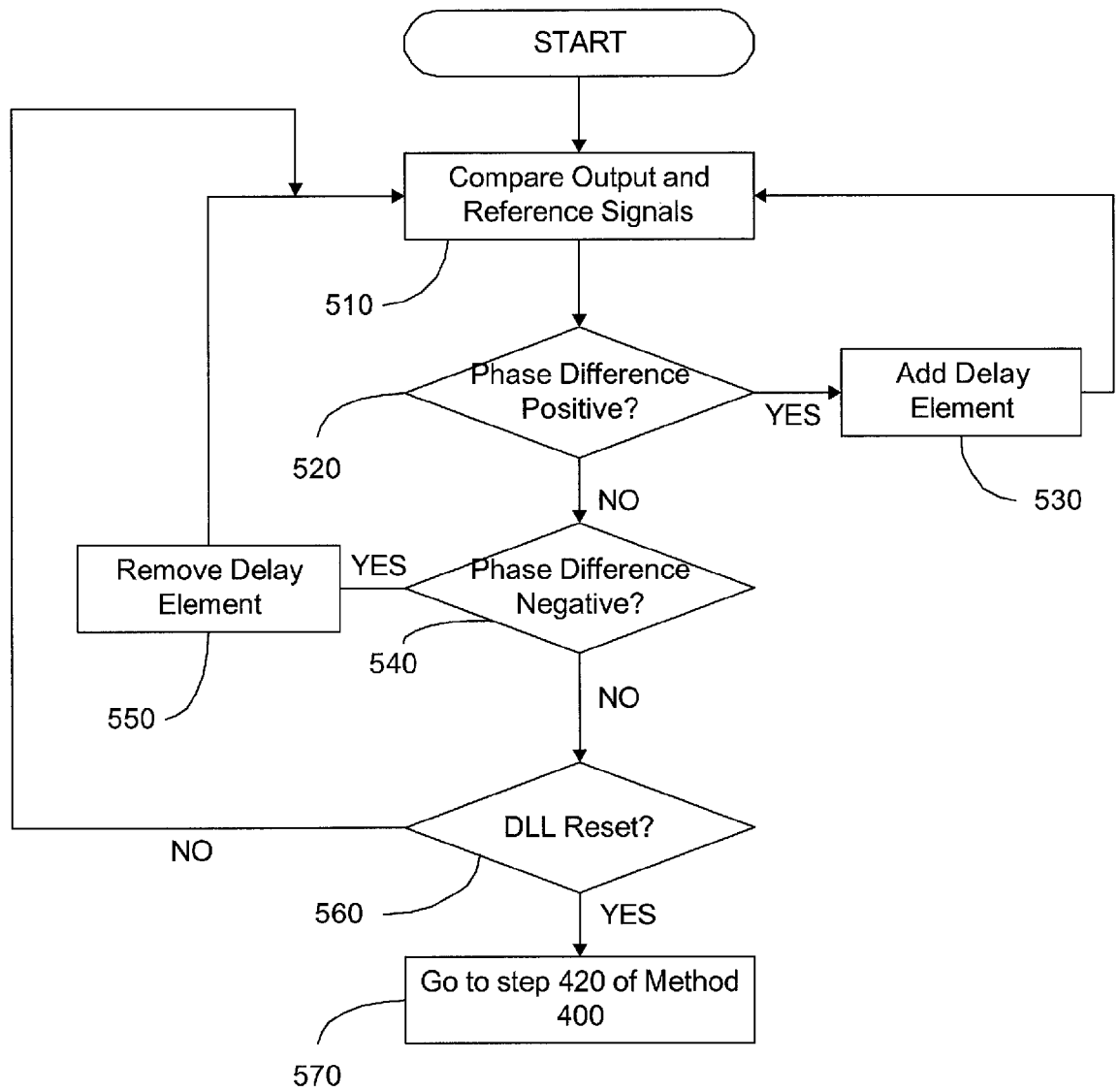
FIG. 5 shows a method for signal adjustment according to an embodiment of the present invention.

FIG. 5 shows an exemplary embodiment of a method 500 for signal adjustment according to an embodiment of the present invention. The method 500 describes operation of the DLL 170 under the normal mode. In step 510, the reference and output signals 101, 121 are indirectly compared when the phase detector 130 compares the signals 111, 151. This step is performed after the DLL 170 has been reset and has reverted to the minimum number of delay elements 122. As described above, the purpose of the DLL 170 is to prevent clock skew by adjusting a delay of the signal 121 so that it most closely matches the reference signal 101, e.g., matching of the rising edges of the output signal 121 and reference signal 101. Thus, in step 520, the DLL 170 determines whether the phase difference between the signals 111, 151 is positive. If the phase difference is positive, an additional fixed-delay element 122 is added by incrementing the counter of the control circuit 140 (step 530). This causes the output signal 121 to be delayed further and may occur up to a maximum possible delay, which is determined by the total number of fixed-delay elements 122 available in the delay element 120. If the phase difference is not positive, the DLL 170 determines, in step 540, whether the phase difference is negative. If this proves to be true, a fixed-delay element 122 is removed by decrementing the counter (step 550). This may occur until the counter reaches a value of zero, at which point no delay elements are selected. Regardless of whether additional delay elements 122 are added or removed, the process returns to step 510, where the phase detector 130 again compares the signals 111, 151. Thus, the output signal 121 is continuously adjusted, with delay elements 122 being added or removed as needed until the output signal 121 matches the reference signal 101.

For example, referring again to FIG. 3, an additional delay element 122 over the initial minimum value Nr of two (2) may be needed to provide the best match between the signals 101, 121. In such a case, the output of the delay element 120 may be output signal 314, e.g., the output signal from the third delay element 122. If, during a course of operation, the DLL 170 determines that less delay is required, delay elements 122 are incrementally removed. Thus, the counter may be decremented to indicate a current value of one (1), which corresponds to the output signal 310, e.g., the output signal from the first delay element 122.

If the signals 101, 121 are matched, the process continues to step 560 where it is determined whether the DLL 170 needs to be reset. The resetting of the DLL 170 may be manual or may occur upon some condition (e.g., an error condition). Those skilled in the art will understand that there are many manners of triggering a DLL reset and any of these manners may be implemented in the exemplary DLL 170. Once it is determined that the DLL 170 is reset, the process goes to step 420 of the method 400 shown in FIG. 4, where the DLL 170 is initialized.

Embodiments of the present invention allow for DLL configuration at different stages providing flexibility across different applications such as for accounting for the trade off between DLL adjustment headroom and jitter margin in various applications. The DLL 170 may be configured according to end-user specifications rather than fixing an initial value Nr for all users. Furthermore, in embodiments where the system 100 allows for the value of the Nr to be altered, the flexibility is achieved by enabling headroom/jitter margin adjustment depending on a change in usage (e.g., selecting a different application).

There are many modifications of embodiments of the present invention that will be apparent to those skilled in the art without departing from the teachings herein. The embodiments disclosed herein are for illustrative purposes only and are not intended to describe the bounds of the present invention, which is to be limited only by the scope of the claims appended hereto.

What is claimed is:

1. A method, comprising:
   receiving a first signal;
   determining a first characteristic of the first signal, the characteristic being a time based characteristic;
   receiving a second signal; and
   processing the second signal through a predetermined range of delay elements, an initial minimum number of delay elements in the predetermined range being adjustable using one of a mode register set command, a fuse and an e-fuse, the processed second signal having a second characteristic substantially corresponding to the first characteristic of the first signal.

2. The method of claim 1, wherein the processing of the second signal occurs after receiving a reset signal.

3. The method of claim 1, wherein the first signal is a reference signal.

4. The method of claim 1, wherein the first characteristic is a phase of the first signal.

5. The method of claim 1, further comprising:
   locking the second signal onto the first signal when the first and second characteristics differ by increasing a current number of delay elements.

6. A delay locked loop, comprising:
   a cascaded plurality of delay elements, each delay element having a substantially fixed delay time, wherein a signal output by one of the delay elements includes a delay corresponding to the fixed delay time of the one of the delay elements and preceding cascaded delay elements; and
   a memory storing a value corresponding to an initial minimum number of delay elements, wherein, when the delay locked loop is reset, signals are processed through the initial minimum number of delay elements,
   wherein the value stored in the memory is adjusted using one of a mode register set command, a fuse and an e-fuse.

7. The delay locked loop of claim 6, wherein each delay element is a non-oscillating first order circuit.

8. The delay locked loop of claim 7, wherein each delay element includes one of a resistor-capacitor circuit and an inverter.

9. The delay locked loop of claim 6, wherein the memory is a register.

10. A system, comprising:
    a phase detector receiving a reference signal and an input signal and detecting a phase difference between the signals;
    a delay circuit including a plurality of delay elements, the delay circuit processing the input signal through a number of delay elements to substantially match the phase of the input signal to the reference signal, wherein the number is at least a predetermined initial minimum number of delay elements, wherein the predetermined initial minimum number of delay elements is adjustable; and
    a memory storing the predetermined initial minimum number of delay elements, wherein the predetermined initial minimum number of delay elements is set in the memory based on one of a mode register set command, a fuse and an e-fuse.

11. The system of claim 10, further comprising:
    a digital counter selecting an output of the delay circuit corresponding to the number of delay elements, the output outputting the processed input signal that substantially matches the phase of the reference signal.

\* \* \* \* \*